United States Patent
Diab et al.

(10) Patent No.: US 7,996,987 B2
(45) Date of Patent: Aug. 16, 2011

(54) SINGLE FOOTPRINT FAMILY OF INTEGRATED POWER MODULES

(75) Inventors: Wael William Diab, San Francisco, CA (US); Shimon Elkayam, Milton (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/581,354

(22) Filed: Oct. 17, 2006

(65) Prior Publication Data

US 2008/0086870 A1    Apr. 17, 2008

(51) Int. Cl.
*H05K 3/30*    (2006.01)
*H01S 4/00*    (2006.01)

(52) U.S. Cl. .............................. 29/832; 29/592.1; 29/836

(58) Field of Classification Search .................. 29/592.1, 29/832–836
See application file for complete search history.

(56) References Cited

U.S. PATENT DOCUMENTS

| | | | |
|---|---|---|---|
| 4,489,365 A | 12/1984 | Daberkoe | |
| 4,965,710 A * | 10/1990 | Pelly et al. ................. | 363/56.03 |
| 5,959,845 A | 9/1999 | Faucher | |
| 6,496,383 B1 * | 12/2002 | Herrell et al. ................. | 361/780 |
| 6,740,969 B1 * | 5/2004 | Hirashima ..................... | 257/723 |
| 6,982,574 B2 * | 1/2006 | Harriman et al. .............. | 327/108 |
| 7,086,019 B2 * | 8/2006 | Keller et al. ........................ | 716/4 |
| 7,088,004 B2 * | 8/2006 | Standing ........................ | 257/775 |
| 7,187,562 B2 * | 3/2007 | Stojcic et al. .................... | 363/17 |
| 7,231,535 B2 * | 6/2007 | Le Creff et al. ................ | 713/340 |
| 7,256,479 B2 * | 8/2007 | Noquil et al. ................. | 257/666 |
| 7,285,973 B1 * | 10/2007 | Mardi et al. ................... | 324/765 |
| 7,363,525 B2 * | 4/2008 | Biederman et al. ........... | 713/340 |
| 2002/0136042 A1 * | 9/2002 | Layden et al. ................. | 363/146 |
| 2003/0085456 A1 * | 5/2003 | Lee et al. ........................ | 257/686 |
| 2004/0027103 A1 * | 2/2004 | Boylan ........................... | 323/266 |
| 2004/0057208 A1 * | 3/2004 | Baeumel et al. ............... | 361/688 |
| 2004/0168818 A1 * | 9/2004 | Layden et al. ................... | 174/50 |
| 2004/0201094 A1 | 10/2004 | Sato et al. | |
| 2004/0207055 A1 | 10/2004 | Iwasa | |
| 2004/0245969 A1 * | 12/2004 | McClean ........................ | 323/247 |
| 2005/0121764 A1 * | 6/2005 | Mallik et al. ................... | 257/686 |
| 2005/0240605 A1 * | 10/2005 | Knoblock et al. ............. | 707/100 |
| 2006/0146504 A1 * | 7/2006 | Belson et al. .................. | 361/728 |
| 2006/0220191 A1 * | 10/2006 | Sundstrom ..................... | 257/669 |
| 2006/0238332 A1 * | 10/2006 | Carle et al. ................. | 340/539.1 |
| 2007/0023889 A1 * | 2/2007 | Salmon .......................... | 257/698 |
| 2007/0108580 A1 * | 5/2007 | Goller ............................ | 257/686 |
| 2008/0035612 A1 * | 2/2008 | Chang et al. ............. | 219/121.44 |

OTHER PUBLICATIONS

Freescale Semiconductor, Single Intelligent High-Current Self-Protected Silicon High Side Switch (2.0mΩ), Document No. MC33982, Rev. 13.0, Jul. 2007.
European Search Report.

* cited by examiner

Primary Examiner — A. Dexter Tugbang
Assistant Examiner — David P Angwin
(74) Attorney, Agent, or Firm — Duane S. Kobayashi

(57) ABSTRACT

A system and method for producing a family of power modules having a common footprint that enables the customer to flexibly choose a power module size without incurring the costs of a relayout of a system design. In one embodiment, a board layout can be designed using a selected power module footprint size that supports an installation of any of a plurality of power modules. The power module that is used in a board layout can be selected based on a measurement of an amount of power consumed by the one or more loads.

17 Claims, 5 Drawing Sheets

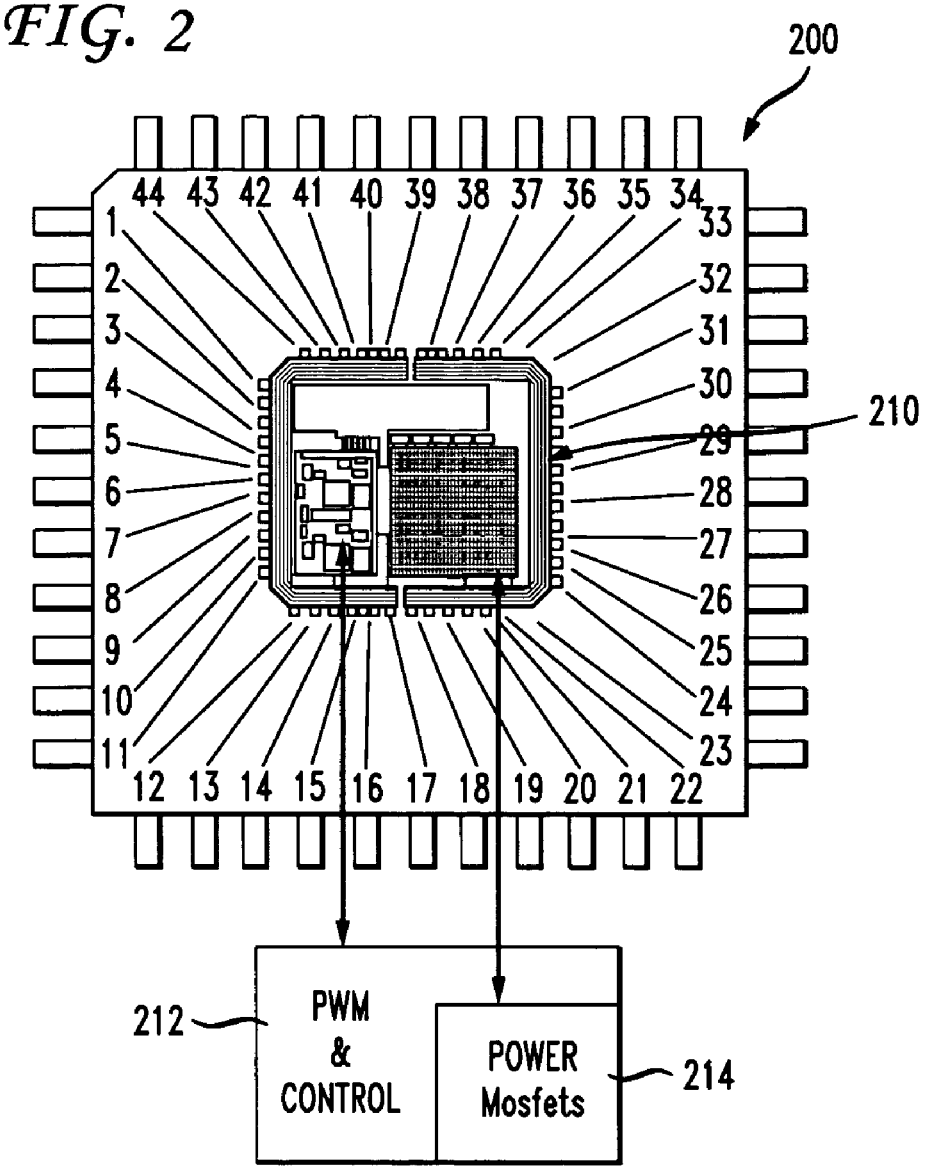

SINGLE FOOTPRINT FAMILY OF INTEGRATED POWER MODULES

BACKGROUND

1. Field of the Invention

The present invention relates generally to power modules and, more particularly, to a family of integrated power modules having a common footprint.

2. Introduction

Conventional networking point-of-load (POL) solutions typically include an external field effect transistor (FET). The size of this external FET is typically based on estimates of worst-case power budgets produced by circuit and board level designers. As is customary, power budgets are propagated through the design process in a worst-case fashion to ensure that the actual power drawn by the finally designed load does not exceed the capacity of the initially designed FET.

If testing of the finally designed load indicates that the power requirement exceeds the capacity of the initially designed FET, then a cascading set of design changes could result due to the change in the size, and hence capacity, of the FET. This propagation of changes is even more pronounced where the FET is integrated into the power module along with the controller. In this scenario, the footprint of the entire power module would need to be modified due to the increase in size of the FET. This change in the footprint of the power module would necessitate large changes in board design to accommodate the new design. In general, the risks associated with late-stage modifications of board designs leads to conservative estimates of the power budget through the design process.

A negative consequence of the use of conservative power estimates is a power module design that greatly exceeds the power requirement of the finally designed load. As a reduction in the size of the FET would also necessitate late-stage design changes, the designer may be forced to use a larger FET than is necessary. This leads to an increase in the costs associated with the end product, and ultimately to the competitiveness of the product in the marketplace. What is needed therefore is a power module design that provides flexibility in the design process.

SUMMARY

A system and/or method for single footprint family of integrated power modules, substantially as shown in and/or described in connection with at least one of the figures, as set forth more completely in the claims.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 2 illustrates on example of a power module having a single die.

DETAILED DESCRIPTION

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

Figure 1:
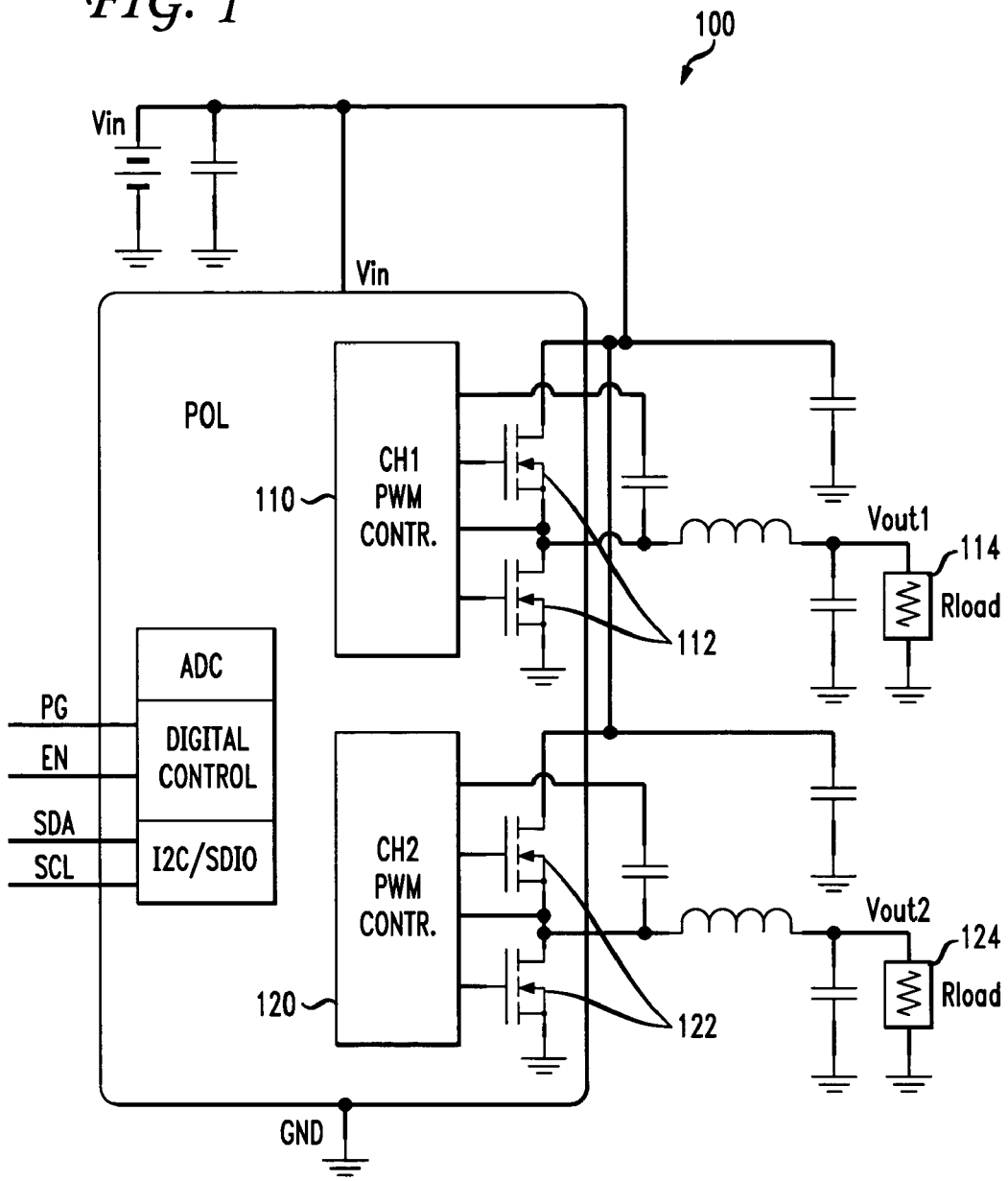
FIG. 1 illustrates an embodiment of a power module.

As noted, power module technology is moving forward towards an integrated FET design. One example of an integrated FET design is illustrated in FIG. 1. As illustrated, POL power module 100 includes integrated FETs in a two-phase design. Specifically, pulse width modulation (PWM) controller 110 is designed to control FETs 112, which in turn drive load 114, while PWM controller 120 is designed to control FETs 122, which in turn drive load 124. As would be appreciated, loads 114 and 124 can represent any type of system/subsystem that is powered off of the rail. For example, loads 114 and 124 can represent communication system components such as a line card, mother board, etc.

In the example of FIG. 1, power module 100 is designed to drive two loads. As would be appreciated, power module 100 can be designed to deliver power to any number of loads, which are each designed to operate at a given voltage such as 0.6V, 0.9V, 1.0V, 1.1V, 1.2V, 1.25V, 1.5V, 1.8V, 2.5V, 3.3V, 5.0V, etc.

As will become apparent in the following description, the principles of the present invention are not dependent on certain design choices of the power module. For example, power module 100 can be designed to convert AC or DC input power to one of AC or DC output power. Further, power module 100 can be designed to include controllers other than PWM controllers. For example, power module 100 can also be designed with resonant mode controllers, hysteretic controllers, fuzzy logic controllers, or the like.

As noted, conventional system design processes typically estimate the worst-case power requirements for a particular load. This worst-case power requirement estimate is then used to drive the sizing of the FETs in the power module. The actual power requirement of a particular load is only tested after the system is specified and built.

Typically, the actual power drawn by a load is far less than the initial conservative power estimates. This results due to the risks associated with having a power module that is undersized for the finally designed load. If the initial power estimates prove to be too low, then the system designer would need to boost the capacity (i.e., size) of the FET, which would therefore lead to a complete relayout of the design. Conversely, if the initial power estimates prove to be too high, then the system designer could choose to reduce the capacity of the FET, which would also lead to a complete relayout of the design. As would be appreciated, in either case, the difficulties inherent in generating an initial power estimate for the load can lead to layout design changes late in the product development cycle.

The present invention seeks to provide system designers with the flexibility in accommodating continual changes in power requirements during the design process. Indeed, it is a feature of the present invention that system designers can select a single power module for a system design that has a footprint that is consistent across a range of power levels. In this process, the particular power level chosen for the power module can be specified later in the design process, wherein adjustments to the power requirements would not result in a change in the size of the overall power module.

To illustrate this feature of the present invention, reference is made to the example power module illustrated in FIG. 2. In this illustrated example, power module 200 includes a single die 210 that integrates the FETs 214 with the controller 212. This single die 210 is then coupled to pins 1-44 to produce power module 200. At this point, it should be noted that the power module could also be designed as a multi-chip module, wherein a plurality of dies are contained therein. This multi-chip module design would also enable the benefits of the present invention disclosed herein.

As illustrated, pins 1-44 of power module 200 define a footprint that is used by system designers in the board layout that incorporates the power module. In conventional design processes, this footprint is generally proportional to the power capacity of the power module. Once a conservative power estimate is generated, the power module would then be designed to meet the needed power specifications. The footprint of the power module design would then be sized in accordance with the die that is incorporated within the power module. This footprint size would then be used in the board layout design. Since this footprint size is typically minimized with respect to the die contained within, a change in the size of the die would typically force a change in the footprint. As noted above, this change in footprint can produce a cascading series of changes in the board layout.

In accordance with the present invention, the footprint of a power module is determined based on considerations other than the size of the die contained within. These additional considerations are focused on producing flexibility in the design process by eliminating the heavy dependence on conservative power estimates.

Figure 3C:
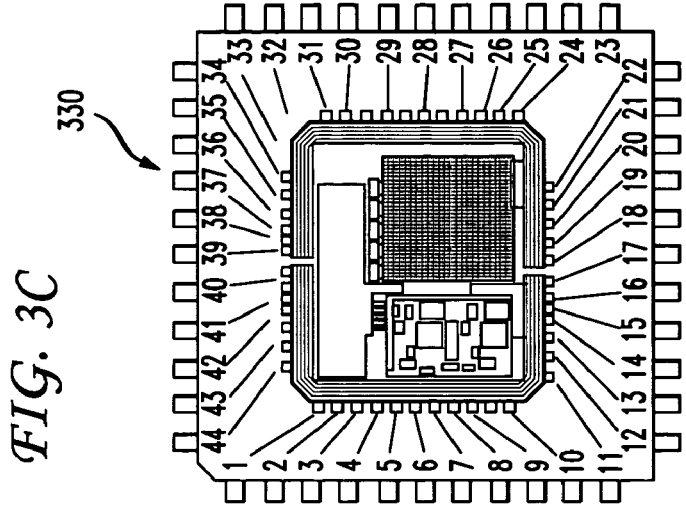
FIGS. 3A-3C illustrate an example of a family of power modules.
Figure 3B:
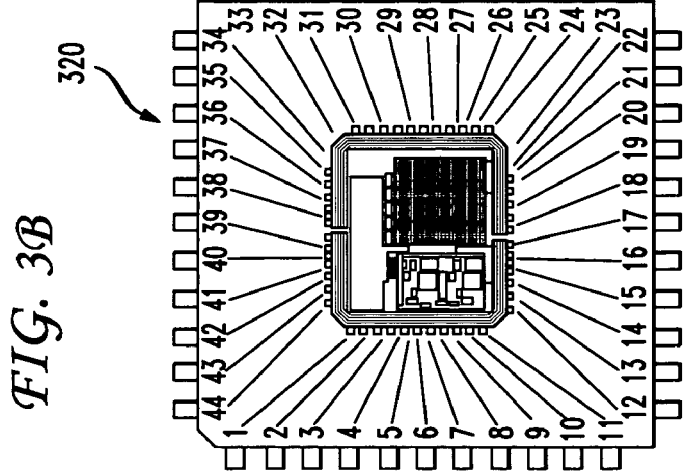
Figure 3A:
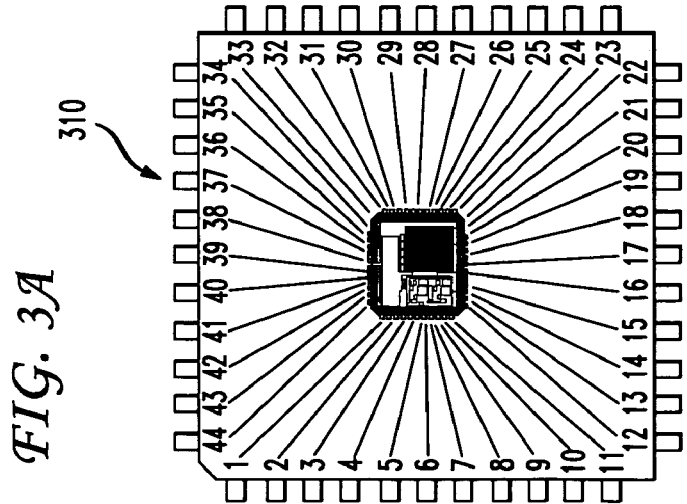

To illustrate this feature of the present invention, reference is made to the family of power modules illustrated in FIGS. 3A-3C. In this illustration, power module 200 is shown again as power module 320 in FIG. 3B. FIGS. 3A and 3C illustrate power modules 310 and 330, respectively. As illustrated, each of power modules 310, 320, and 330 house a single die, wherein each die has a different size. The variations in the size of the dies correspond to different power capacities for power modules 310, 320, 330. Notwithstanding these different power capacities, the footprint of each of power modules 310, 320, 330 is the same. As such, power modules 310, 320, 330 represent a family of power modules that produce a range of power capacities for a given footprint. As would be appreciated, the range of power capacities for a given footprint can be defined to include any number of power modules.

Figure 4:
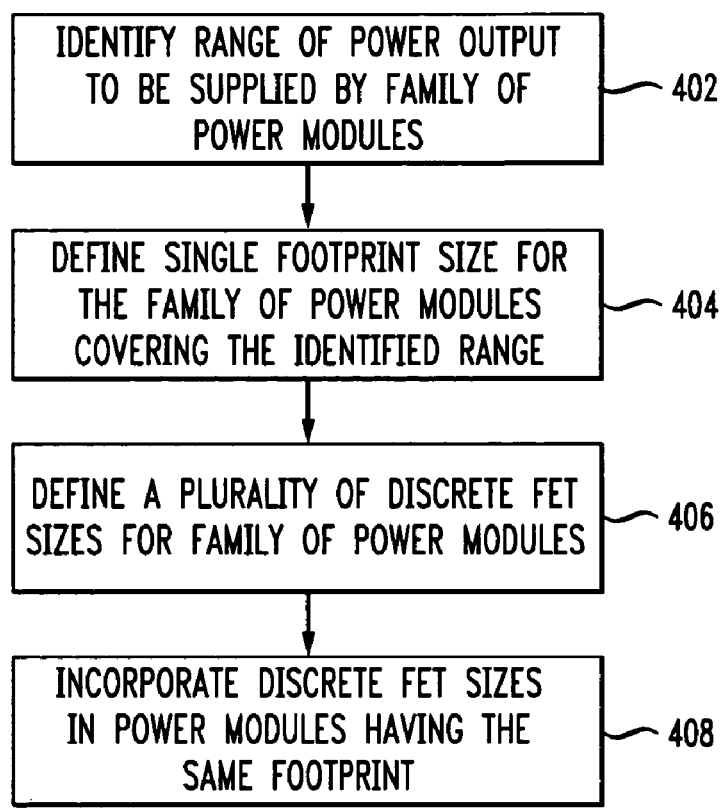
FIG. 4 illustrates a flowchart of a process for defining a family of power modules.

FIG. 4 illustrates a process for defining a family of power modules having a single footprint. As illustrated, the process begins at step 402 where a power module supplier identifies a range of power outputs to be supplied by a family of power modules. This range of power outputs can be defined in various ways. For example, the range of power outputs can be based on predefined power classes for a given application, de facto standards, or power module supplier considerations such as volume, manufacturing efficiencies, customer history, anticipated demand, etc.

Once the range of power outputs is identified, at step 404, a single footprint size is selected to cover the power modules that span the range of power outputs. FIGS. 3A-3C illustrate one example of the single footprint size that is selected for the family of power modules 310, 320, and 330. In one design scenario, the single footprint size can be selected as the minimum size that can accommodate the largest FET size needed to provide a power output at the top of the range of power outputs. This need not be a requirement, however. In general, the single footprint size can be selected as any size that can accommodate the various FET sizes in that class.

In the flowchart of FIG. 4, the range of power outputs is defined prior to the single footprint size. It should be noted that in an alternative embodiment, the single footprint size can be defined first, with the range of power outputs being defined based on the selection of the single footprint size.

Regardless of the order of steps 402 and 404, the key to providing a family of power modules is the defining, at step 406, of a plurality of discrete FET sizes for that family of power modules. In one embodiment, these discrete FET sizes are predefined in incremental steps to cover the range of power outputs. This embodiment would enable a customer to select the FET having the next largest size that would satisfy the finally identified power requirement. Assuming that the incremental steps have a reasonable granularity, the customer would then be able to closely match the FET size to the finally identified power requirement.

It should be noted that in one embodiment, incremental FET sizes need not be predefined. Rather, a customer could choose to specify a specific FET size from a continuum of FET sizes that would fit within the single footprint size.

Finally, at step 408, discrete FET sizes are incorporated within power modules having the same footprint. Whether predefined incremental FET sizes are used or customer specific sizes are provided, multiple FET sizes are matched to power modules having the same footprint. The manufacturing of such a family of power modules is an important aspect of enabling needed flexibility in the design process.

Figure 5:
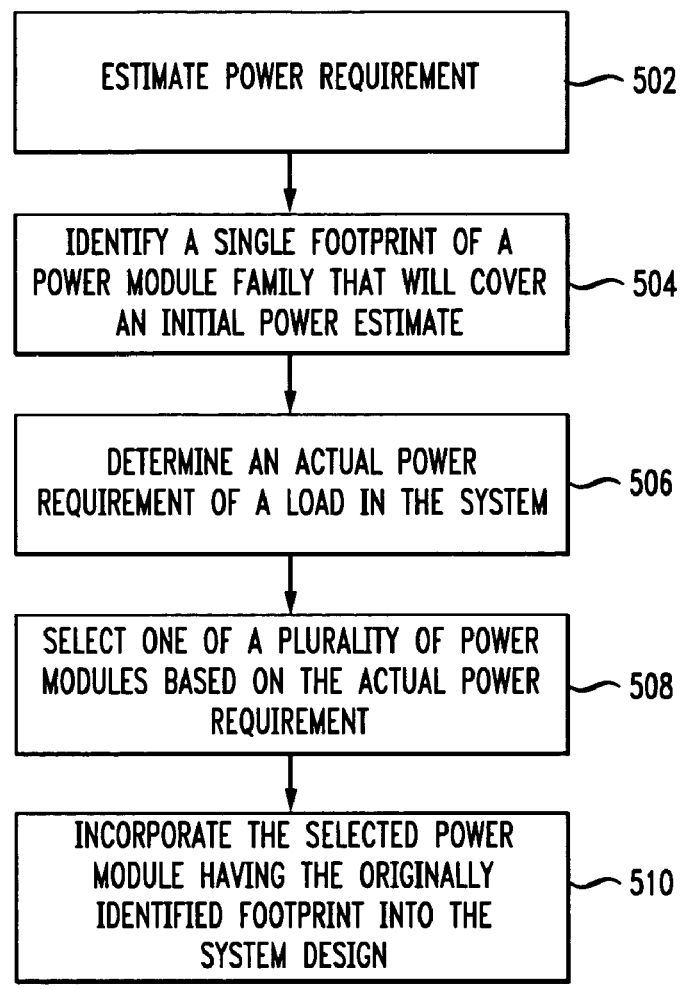
FIG. 5 illustrates a flowchart of a design process that leverages a family of power modules.

Having described an embodiment of defining a family of power modules having a single footprint, the utility of such a family of power modules in the design process is now provided with reference to FIG. 5. As illustrated, the design process begins at step 502 where an initial power estimate is determined. This initial power estimate can be determined using conventional system design methodologies. In accordance with the present invention, this initial power estimate need not be determined in an overly conservative manner. This results due to the known flexibility in the design process as described below.

Once an initial power estimate is generated, at step 504, a footprint common to a family of power modules that will cover the initial power estimate (including expected variations) is identified. In one embodiment, this footprint can be determined based on data sheets provided by the power module supplier that cover a range of power outputs. This single footprint can then be used in the layout of a logic board.

Next, at step 506, the actual power requirement of a load in the system is determined. As noted above, this actual power requirement may not be known until the actual circuit has been designed and tested. This occurs late in the design process.

Once the actual power requirement is known to some degree of confidence, at step 508, a single power module in a family of power modules having the identified footprint is selected. In one embodiment, the single power module can be selected from a plurality of predefined power modules. The closeness of the match between the selected power modules to the actual power requirement would depend on the granularity of the differences between the plurality of predefined power modules. In an alternative embodiment, the power module can be specified based on the actual power requirement. Here, the power module could be determined to closely match the actual power requirement. In general, the difference between these two approaches could simply be one of time in providing the power module to the customer.

Finally, at step 510, the selected power module is incorporated into the originally identified footprint of the power modules in the system design. Significantly, the originally identified footprint was not changed through the design process. Rather, the footprint was originally selected with the knowledge that it would cover expected differences between the actual power requirement and the initial power estimate. This flexibility therefore ensures that layout redesigns based on faulty power consumption estimates would be minimized. In particular, the system designer now has the ability to size up or down the capacity of the FET without concern for the costs of a relayout of the design.

While the present invention has been discussed above in the context of POL power modules, the principles of the present invention are not so limited in scope. The principles of the present invention can be applied to numerous other power module contexts that would benefit from the design flexibility produced by a family of power modules having a common footprint.

One example application is a power over Ethernet (PoE) application. In this PoE application, electrical power is sent over Ethernet cables to power such remote devices as Internet phones and wireless access points. Separate power cords are therefore unnecessary.

Figure 6:
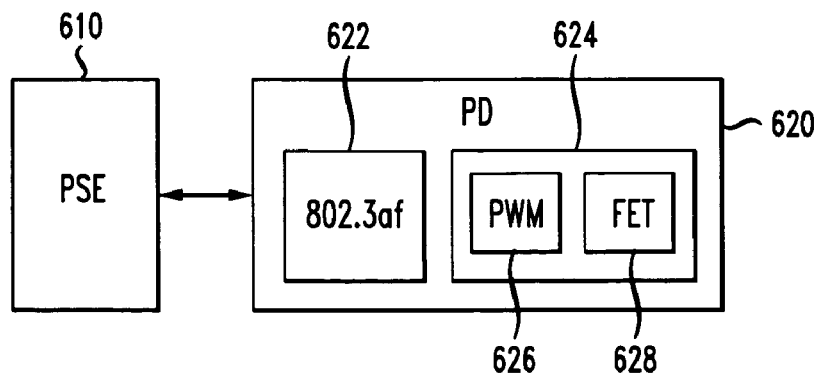
FIG. 6 illustrates a power over Ethernet example application.

FIG. 6 illustrates a high-level overview of a PoE application that benefits from the principles of the present invention. In this illustration, a power source equipment (PSE) 610 is shown delivering power to a powered device (PD) 620. In general, PSE 610 can deliver up to 15.4 W of power to a plurality of PDs (only one PD is shown in FIG. 6 for simplicity). Details of the delivery of power from PSE 610 to PD 620 are provided in the IEEE 802.3af standard.

As further illustrated in FIG. 6, PD 620 includes 802.3af module 622. This module includes the electronics that would enable PD 620 to communicate with PSE 610 in accordance with the 802.3af standard. PD 620 also includes power module 624, which further includes a PWM controller 626 and power FET 628. As noted above, PWM controller 626 and power FET 628 can be incorporated in a single die, or can be on separate dies as part of a multi-chip module.

In the IEEE 802.3af standard, different classes of PDs are defined based on the power levels to be delivered at the PD. Once a PD is classified, the PSE would then determine which power level to deliver to the PD based on the determined classification. In the 802.3af standard, the PSE would be designed to deliver a minimum output power of 4.0 W, 7.0 W, or 15.4 W to the classified PD.

This PoE application illustrates an example where distinct families of PDs are defined based on their power classification. In one embodiment, each power classification can be used to define its own family of power modules. For example, the 4.0 W power classification would have a first family of power modules and the 7.0 W power classification would have a second family of power modules. With this arrangement, PD designers could then design a layout that accommodates a power module having a footprint for the anticipated class of the device. The exact power module chosen would not need to be determined until the exact power requirement is known. Regardless of the power module chosen from the family, it would simply slot into the footprint defined for that family.

As would be appreciated, the family of power modules need not necessarily be defined based on the standardized power classifications. In other embodiments, a family of power modules can be defined to span all or part of one or more power classifications.

In a similar fashion to the PD embodiment of FIG. 6, the principles of the present invention can also be applied to modules within a PSE. In one embodiment, the PSE could include a power module that contained the 802.3af circuitry along with a FET. Here, multiple versions of the PSE power modules could be produced with FETs integrated inside the package. Specifically, the 802.3af portion can be fixed but the internal FETs could be scaled for different power levels. For example, a FET can be designed for 8 W (low power), 15.4 W (standard power), 25 W (enhanced power), or 30 W (future standard power). As would be appreciated, these integrated power modules can be used for single or multiport PSEs.

Another example application of the principles of the present invention is in the area of relay switches, such as those found in the automotive industry. In this application, a power controller would be used to provide on-off functionality for a FET that delivers power to an automotive subsystem (e.g., lights). Here, a family of relays having a common footprint or other packaging characteristic could be defined. Depending on the power needed by the particular subsystem (e.g., 5-50 Amps), the system designer would then choose the particular relay from the family of relays. Again, this choice could be delayed until the actual power requirements are known, the last minute changes of which would not dictate system redesigns.

These and other aspects of the present invention will become apparent to those skilled in the art by a review of the preceding detailed description. Although a number of salient features of the present invention have been described above, the invention is capable of other embodiments and of being practiced and carried out in various ways that would be apparent to one of ordinary skill in the art after reading the disclosed invention, therefore the above description should not be considered to be exclusive of these other embodiments. Also, it is to be understood that the phraseology and terminology employed herein are for the purposes of description and should not be regarded as limiting.

What is claimed is:

1. A power module method, comprising:

selecting a first power module footprint size from a plurality of power module footprint sizes for a power module that includes a controller and a power transistor, said first power module footprint size being used by each of a first plurality of power modules that each have a power output that falls within a first power range, said plurality of power module footprint sizes also including a second power module footprint size that is used by each of a second plurality of power modules that each have a power output that falls within a second power range different from said first power range;

designing a board layout using said selected first power module footprint size, a space in said board layout defined by said selected first power module footprint size supporting an installation of any one of said first plurality of power modules;

after completion of said board layout design, measuring an actual amount of power consumed by one or more loads served by said power module;

selecting one of said first plurality of power modules for use in said board layout based on said power measurement; and installing said selected one of said first plurality of power modules in a circuit board having said board layout.

2. The method of claim 1, wherein said selecting comprises selecting a footprint size of a point of load power module.

3. The method of claim 1, wherein said selecting comprises selecting a footprint size of a power module for a powered device in a power over Ethernet application.

4. The method of claim 1, wherein said selecting comprises selecting a footprint size of a power module for a power source equipment in a power over Ethernet application.

5. The method of claim 1, wherein said power module is a multi-chip module having a power transistor on a separate die from a controller.

6. The method of claim 5, wherein each of said plurality of power module footprint sizes is associated with a different one of a plurality of power over Ethernet power classifications.

7. The method of claim 6, wherein said plurality of power over Ethernet power classifications are associated with 4 W, 7 W, and 15.4 W power classifications.

8. The method of claim 1, wherein said designing comprises designing with the aid of a computer.

9. The method of claim 1, wherein said measuring comprises measuring an actual amount of power consumed by one or more loads when power is served by said power module.

10. A power module method, comprising:
   estimating a power requirement of one or more loads;
   selecting, based on said estimated power requirement of said one or more loads, a first power module footprint size from a plurality of power module footprint sizes, said first power module footprint size being used by each of a first plurality of power modules that each have a power output that falls within a first power range, said first power range including said estimated power requirement, said plurality of power module footprint sizes also including a second power module footprint size that is used by each of a second plurality of power modules that each have a power output that falls within a second power range different from said first power range;
   designing a board layout using said selected first power module footprint size, a space in said board layout defined by said selected first power module footprint size supporting an installation of any one of said first plurality of power modules;
   after completion of said board layout design, measuring an actual amount of power consumed by one or more loads served when power is served to said one or more loads;
   selecting one of said first plurality of power modules for use in said board layout based on said power measurement; and
   installing said selected one of said first plurality of power modules in a circuit board having said board layout.

11. The method of claim 10, wherein said selecting comprises selecting a footprint size of a point of load power module.

12. The method of claim 10, wherein said selecting comprises selecting a footprint size of a power module for a powered device in a power over Ethernet application.

13. The method of claim 10, wherein said selecting comprises selecting a footprint size of a power module for a power source equipment in a power over Ethernet application.

14. The method of claim 10, wherein said power module is a multi-chip module having a power transistor on a separate die from a controller.

15. The method of claim 14, wherein each of said plurality of power module footprint sizes is associated with a different one of a plurality of power over Ethernet power classifications.

16. The method of claim 15, wherein said plurality of power over Ethernet power classifications are associated with 4 W, 7 W, and 15.4 W power classifications.

17. The method of claim 10, wherein said designing comprises designing with the aid of a computer.

\* \* \* \* \*